(12) United States Patent
Signamarcheix et al.

(10) Patent No.: US 8,318,555 B2
(45) Date of Patent: Nov. 27, 2012

(54) METHOD OF PRODUCING A HYBRID SUBSTRATE HAVING A CONTINUOUS BURIED ELECTRICALLY INSULATING LAYER

(75) Inventors: Thomas Signamarcheix, La Terrasse (FR); Franck Fournel, Villard-Bonnot (FR); Laurent Clavelier, Grenoble (FR); Chrystel Deguet, Saint Ismier (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 44 days.

(21) Appl. No.: 13/125,953

(22) PCT Filed: Oct. 29, 2009

(86) PCT No.: PCT/FR2009/052091
§ 371 (c)(1),
(2), (4) Date: Apr. 25, 2011

(87) PCT Pub. No.: WO2010/049654
PCT Pub. Date: May 6, 2010

(65) Prior Publication Data
US 2011/0207293 A1    Aug. 25, 2011

(30) Foreign Application Priority Data
Oct. 31, 2008 (FR) ........................ 08/06072

(51) Int. Cl.
*H01L 21/84* (2006.01)
(52) U.S. Cl. ........ 438/166; 438/142; 438/458; 438/479; 257/64; 257/65; 257/66; 257/69; 257/70; 257/E21.211; 257/E21.328; 257/E21.379
(58) Field of Classification Search ........................ None
See application file for complete search history.

(56) References Cited

U.S. PATENT DOCUMENTS

| | | |
|---|---|---|
| 5,310,446 A | 5/1994 | Konishi et al. |
| 6,429,094 B1 * | 8/2002 | Maleville et al. ............. 438/455 |
| 7,060,585 B1 | 6/2006 | Cohen et al. |

(Continued)

FOREIGN PATENT DOCUMENTS

| WO | WO 03/083930 A1 | 10/2003 |
|---|---|---|
| WO | WO 2008/114107 A2 | 9/2008 |

OTHER PUBLICATIONS

Yang et al., "High Performance CMOS Fabricated on Hybrid Substrate With Different Crystal Orientations", *IEDM 03* 2003, pp. 453,456.

(Continued)

*Primary Examiner* — Charles Garber
*Assistant Examiner* — Yasser Abdelaziez
(74) *Attorney, Agent, or Firm* — Brinks Hofer Gilson & Lione (57) ABSTRACT

A method for producing a hybrid substrate includes preparing a first substrate including a mixed layer and an underlying electrically insulating continuous layer, the mixed layer made up of first single-crystal areas and second adjacent amorphous areas, the second areas making up at least part of the free surface of the first substrate. A second substrate is bonded to the first substrate, the second substrate including on the surface thereof, a reference layer with a predetermined crystallographic orientation. The first substrate is bonded to the second substrate by hydrophobic molecular bonding of at least the amorphous areas. A recrystallization of at least part of the amorphous areas to solid phase is carried out according to the crystallographic orientation of the reference layer, and the two substrates are separated at the bonding interface.

13 Claims, 4 Drawing Sheets

U.S. PATENT DOCUMENTS

2005/0116290 A1    6/2005    De Souza et al.
2007/0013001 A1    1/2007    Furukawa et al.
2007/0105315 A1*   5/2007    Barbe et al. .................. 438/258

OTHER PUBLICATIONS

Yang et al., "Hybrid-Orientation Technology (HOT): Opportunities and challenges", *IEEE Transaction on Electron Devices*, vol. 53, No. 5, May 2006, pp. 965-978.

Yin et al., "Direct Silicon Bonded (DSB) Substrate Solid Phase Epitaxy (SPE) Integration Scheme Study for High Performance Bulk CMOS", 1-4244-0439-8 © 2006 *IEEE*, 1 pg.

Yang et al., "Silicon-on-Insulator MOSFETs with Hybrid Crystal Orientations" *Symposium on VLSI Technology digest of Technical Papers*, 2006, 2 pgs.

International Search Report, dated Feb. 2, 2010.

* cited by examiner

METHOD OF PRODUCING A HYBRID SUBSTRATE HAVING A CONTINUOUS BURIED ELECTRICALLY INSULATING LAYER

Related subject matter is disclosed in co-pending, commonly-assigned patent application titled "Method In The Microelectronics Fields Of Forming A Monocrystalline Layer" filed on even date herewith as a U.S. Nationalization of PCT Application No. PCT/FR2009/052096.

TECHNICAL FIELD

The invention concerns a method of forming a hybrid substrate, that is to say a micro-technological structure comprising a mixed layer formed from families of zones that are different, as regards their constituent materials or at least as regards their crystalline orientations. Such a substrate is sometimes also called "mixed substrate", due to the mixing of the zones within the same layer. More particularly, the invention concerns the production of a hybrid substrate comprising a continuous insulating layer along which the mixed layer extends.

It is to be noted that the thickness of a mixed layer is typically comprised between 1 nm and 1 μm.

BACKGROUND

In the micro-technology field, when it is a matter of producing electronic components, optical or opto-electronic components, or even micro-mechanical components (for example micro-accelerators), silicon substrates are often used, but it must be clearly understood that other materials may also be used, often other semiconductor materials, formed from elements of group IV of the periodic table of the elements (germanium, in particular, and its alloys with silicon), and even groups III-V (in particular GaAs or InP), or even groups II-VI of that table, even $LiNb_{O3}$, SiC, diamond, etc.

The use, and more particularly the formation, of such hybrid substrates, whether the mixed layer is buried or at the surface, is of particular interest for diverse applications, especially in MOS type devices.

Given the limitations encountered by MOSFET devices in terms of performance, the change of the crystalline orientation of the surface of the substrate used (mostly Si), in the same way as the change of the direction of the conduction channel of the transistors, appears as a simple and effective solution. More particularly, many studies have demonstrated the impact of the orientation of the free surface and the direction of the conduction channel on the respective mobility of holes and electrons. Thus improving the mobility of the carriers (holes) can be obtained via the use of a free surface of orientation <110> in comparison with a usual free surface of type <100>, as recently reported by Yang et al. ("High Performance CMOS Fabricated on Hybrid Substrate With Different Crystal Orientations" by Yang, Ieong, Shi, Chan, Chan, Chou, Gusev, Jenkins, Boyd, Ninomiya, Pendleton, Surpris, Heenan, Ott, Guarini, D'Emic, Cobb, Mooney, To, Rovedo, Benedict, Mo, Ng, which appeared in IEDM 03-2003 pp 453-456). However, the CMOS technologies are based on the simultaneous use of n-MOS type transistors (conduction by electrons) and p-MOS type transistors (conduction by holes). Furthermore, a change of the orientation of the surface has antagonistic effects on the electrons and on the holes, thus necessitating two free surface orientations, which are different for these two types of carrier. Thus it is desirable to be able to produce and to make cohabit two types of orientation on the same substrate.

Techniques are already known for producing hybrid structures.

Reference may for example be made to WO-2004/059711 or its U.S. equivalent US 2006/0166461, which provide for the formation of a mixed or hybrid structure by molecular bonding of two substrates one of which comprises on its surface two types of zones which differ in their constituent materials; in that document, these two types of zones are obtained by techniques of lithography, etching, thermal oxidation at the surface and polishing so that thermal oxide is left only in etched areas. An improvement on this technique is proposed in the European patent publication EP-1 923 912 or its U.S. equivalent US 2008/0079123, which teaches the formation of a sacrificial layer ensuring the flatness of the surfaces finally exposed.

Furthermore, the aforementioned document of Yang et al, proposes, instead of using thermal oxidation to fill the etched zones, to hollow out cavities by etching in an SOI substrate (thus with a semiconductor layer above a buried electrically insulating layer), through the insulating layer, and to cause these cavities to be filled by epitaxy from the bottom of those etched zones, which bottom is constituted by a material (under that insulating layer) chosen to have different crystal properties to that of the unetched zones. This technique is commented upon in more detail in "Hybrid-Orientation Technology (HOT): Opportunities and Challenges" by Yang, Chan, Chan, Shi, Fried, Stathis, Chou, Gusev, Ott, Burns, Fischetti, Ieong which appeared in IEEE Transaction on Electron Devices, Vol. 53, N° 5, May 2006, pp 965-978. It should be noted that this technique is incompatible with the desire to have a buried electrically insulating layer that is continuous, since it requires the use of an oxide layer which must be pierced at intervals, opposite each of the etched zones, to enable the growth of zones by epitaxy.

Another production technique is described by Yin et al. (see "Direct Silicon Bonded (DSB) Substrate Solid Phase Epitaxy (SPE) Integration Scheme Study for High Performance Bulk CMOS" by Yin, Sung, Ng, Saenger, Chan, Crowder, Zhang, Li, Ott, Pfeiffer, Bendernagel, Ko, Ren, Chen, Wang, Liu, Cheng, Mesfin, Kelly, Ku, Luo, Rovedo, Fogel, Sadana, Khare, Shahidi, which appeared in 1-4244-0439-8/06/$20.00 © 2006 IEEE,); this technique is based on using a DSB (Direct Silicon Bonding) structure, that is to say one obtained by direct bonding of two silicon substrates with different crystal orientations: by lithography and ion implantation, zones of one of the substrates are selectively rendered amorphous through its full thickness to reach the interface between the two substrates, and the zones rendered amorphous are induced to recrystallize following the crystal properties of the other substrate; it is stated that unless, before recrystallization, trenches are formed between the zones rendered amorphous and the zones that have not been rendered amorphous, two competing recrystallization phenomena are observed, starting from the underlying substrate (following a first crystallographic orientation) and starting from adjacent zones (following another crystal orientation). It should be noted that this technology is incompatible with the presence of a buried electrically insulating layer along zones of different crystallographic orientation (that zone would prevent the crystallization following the crystallographic orientation of the underlying substrate.

Yang et al. (see "Silicon-on-Isolator MOSFETs with Hybrid Crystal Orientations" by Yang, Chan, Kumar, Lo, Sleight, Chang, Rao, Bedell, Ray, Ott, Patel, D'Emic, Rubino, Zhang, Shi, Steen, Sikorski, Newbury, Meyer, To Kozlowski, Graham, Maurer, Medd, Canaperi, Deligianni, Tornello, Gibson, Dalton, Ieong, Shabidi which appeared in Symposium on VLSI Technology Digest of Technical Papers, 2006.) have demonstrated, via a simulation, the importance of depositing such a continuous buried electrical insulator under the zones of different orientation, and have proposed a modification to their method of production (as defined in "Hybrid-Orientation Technology (HOT): Opportunities and Challenges" by Yang, Chan, Chan, Shi, Fried, Stathis, Chou, Gusev, Ott, Burns, Fischetti, Ieong which appeared in IEEE Transaction on Electron Devices, Vol. 53, N° 5, May 2006, pp 965-978) aimed at minimizing the interruptions of the buried electrically insulating layer; this modification consists in providing for the etching through the buried electrically insulating layer to be made over a section less than that of the cavity hollowed out in the layer situated above that insulating layer. It can nevertheless be understood that this improved technique is still incompatible with the desire to have a buried electrically insulating layer that is continuous.

There is thus the need to be able to produce hybrid substrates comprising, adjacent to a buried electrically insulating layer, a mixed layer formed from zones having predefined crystallographic orientations (two different orientations, in practice, but it is understood that it may, in certain cases, be useful to be able to make such a layer comprise zones having, in a predefined manner, one of three (or more) different orientations.

SUMMARY

It may be noted that the technologies mentioned above concern the production of hybrid substrates of which the mixed layer is at the surface, but it is understood that it may also be useful to be able to produce hybrid substrates of which the mixed layer is buried, under another layer which is in practice crystalline.

The invention is directed to a method enabling a hybrid substrate to be produced, simply and reliably, comprising an underlying substrate bearing an electrically insulating continuous layer and a mixed layer, adjacent to that electrically insulating continuous layer, formed from families of monocrystalline zones such that the zones of each family are constituted by a predetermined material while having a specific set of crystal properties (from the point of view of crystallographic orientation and/or from the lattice parameter point of view), without implying any condition concerning the material or the crystal properties of that underlying substrate.

The invention thus provides a method of producing a hybrid substrate comprising:
  preparing a first substrate comprising a mixed layer which has extending along it an electrically insulating continuous underlying layer and which is formed from first monocrystalline zones of at least a first crystalline material and from second adjacent zones of a second material in amorphous form, those second zones forming at least part of the free surface of that first substrate.
  bonding to that first substrate, by hydrophobic molecular bonding over at least those amorphous zones, a second substrate comprising a surface reference layer having a given crystallographic orientation,
  applying at least to the mixed layer a heat treatment adapted to induce the recrystallization in solid phase of at least part of the amorphous zones following the crystallographic orientation of the reference layer, that reference layer acting as a recrystallization seed through the bonding interface, and
  inducing separation, at the bonding interface, between the reference layer of the second substrate and the at least partly recrystallized zones of the first substrate.

It may be noted that the invention thus teaches to induce the recrystallization of the amorphous zones on the basis of a reference layer which is only temporarily mounted on by molecular bonding. For the electrically insulating continuous layer and for the underlying substrate, It is thus possible to choose any materials and crystal properties while having, after separation of the reference layer, a mixed layer of quality entirely comparable to that obtained by following the teaching of Yin et al ("Direct Silicon Bonded (DSB) Substrate Solid Phase Epitaxy (SPE) Integration Scheme Study for High Performance Bulk CMOS" by Yin, Sung, Ng, Saenger, Chan, Crowder, Zhang, Li, Ott, Pfeiffer, Bendernagel, Ko, Ren, Chen, Wang, Liu, Cheng, Mesfin, Kelly, Ku, Luo, Rovedo, Fogel, Sadana, Khare, Shahidi, which appeared in 1-4244-0439-8/06/$20.00 © 2006 IEEE); it is however not necessary to provide for any interruptions within the insulating layer.

It is interesting to note that, since separation is carried out of the seed-forming reference layer from the hybrid substrate, that reference layer may be used for a new hybrid substrate forming cycle (possibly after smoothing treatment or on the contrary roughening of the surface exposed by the separation; see below).

It can be understood that, for the seed-forming layer to be only temporarily attached, it is advantageous for the separation of that layer from the mixed layer to be possible, after recrystallization, by unbonding at the bonding interface or by fracture adjacent to it; this is why, advantageously, either the mechanical strength of the interface is deliberately degraded, or the mechanical strength of the seed-forming layer is deliberately degraded adjacent to that bonding interface (these options may be combined). However, contrary to what could be feared, it has appeared that such a degradation, or weakening, does not prevent the reference layer from efficiently assuming its role of recrystallization seed through the interface.

Such a degradation of the bonding interface, aimed at reducing the bonding energy despite the consolidation which normally occurs on account of a heat treatment such as the recrystallization treatment, may in particular by provided by a roughening treatment of one and/or of the other of the faces destined to be bonded by molecular bonding; for practical reasons, it is advantageous to roughen the free surface of at least the reference layer.

The roughness so obtained is advantageously comprised between 0.1 nm and 1 nm RMS, for example of the order of 0.2 nm RMS (by AFM measurement, that is to say by measurement by atomic force, for example over a surface of 5 microns×5 microns). This roughening is advantageously obtained by etching, for example, at least in the case of monocrystalline silicon, in a solution of water, ammonium hydroxide and hydrogen peroxide ($H_2O$, $NH_4^+/OH^-$ and $H_2O_2$) in the proportions 1-1-5, at 70° C. for 15 min (it is within the capability of the person skilled in the art to choose an appropriate solution for each material to engrave).

Instead of modifying the roughness of the layers destined to be bonded, a sacrificial layer may be provided between these two surfaces, provided this layer keeps the crystalline information to transmit and thereby enables the seed-forming layer to fulfill its role in the recrystallization. By way of example, this sacrificial layer may be an alloy of the materials constituting the amorphous zones and the seed-forming layer, which alloy is formed by epitaxy on the seed-forming layer, for example $Si_xGe_{(1-x)}$ in the case of a mixed layer of silicon bonded to a seed-forming layer of silicon or of germanium. Where it is desired to recrystallize amorphous portions of silicon by a monocrystalline silicon seed, it will be possible to deposit a sacrificial thin film of SiGe on the seed. That layer will have to be of smaller thickness than the critical thickness (thickness up to which SiGe grows with the lattice parameter of the underlying silicon, thereby conserving the crystalline information of the silicon; for $Si_{0.8}Ge_{0.2}$ on Si, limitation is typically made to a thickness of 5 nm. After bonding and annealing for recrystallization, to obtain the separation, it then suffices to eliminate a large part of the seed substrate, for example by mechanical grinding or by fracture situated at a buried weak zone formed in advance in the seed substrate, then to employ one or more selective attack solutions of any appropriate known type to eliminate the residual part of the seed, if any, then the sacrificial layer of SiGe (a known solution for example for selectively engraving SiGe relative to silicon is $HF/HNO_3$).

To facilitate the unbonding, it will also be possible to limit the thermal budget of recrystallization (which tends at the same time to reinforce the bonding interface). It may for example be provided to recrystallize only a small part of the amorphous zones, in practice a part of the thickness thereof, starting from the bonding interface, to limit the duration of application of the recrystallization treatment, then to carry out the unbonding (provided that the bonding interface has moderate strength) then to continue and complete the recrystallization of the amorphous zones by application of a complementary thermal budget. This enables the pre-unbonding thermal budget to be limited (and thus to ensure that the structure will be unbondable) while transferring the crystalline information "from the other side" of the bonding interface. It is to be recalled that the concept of thermal budget encompasses both the temperature of a treatment and its duration.

Such recrystallization in two treatment steps, with a first treatment which is adapted to cause the recrystallization of only a part (in practice, part of the thickness) of the amorphous zones and, after separation, the application of a second heat treatment (or even of several heat treatments) adapted to continue and complete the recrystallization of the amorphous zones, also has, independently of the location at which the separation is made, an energetic advantage since the complementary heat treatment does not need to be applied to the seed-forming layer.

It can easily be understood that, even though it is advantageous, it is not necessary for the recrystallization to be obtained, throughout the zones to recrystallize, over the same part of their thickness; it suffices for the part of those layers which is recrystallized to be sufficiently great to serve as a seed for the rest of the zone, at the time of the heat treatment subsequent to the separation.

One way to degrade the mechanical strength of the reference layer consists in forming at least a part of that layer in a porous form, or in making at least part of that layer porous, after formation, in the vicinity of that interface. In fact, it is not necessary for that porous zone to be exactly adjacent that interface, even if it is advantageous to enable fracture very close to the interface. It can indeed be understood that, when the separation occurs at a location away from the interface, conventional treatments of mechanical and/or chemical and/or thermal polishing enable the residue to be eliminated from the reference layer remaining bonded to the film after fracture in the porous layer.

As a variant the weakening of the reference layer may be made, to a very small given depth, by implantation of ions, in accordance with the technique known under the name "Smart Cut™". Such implantation is advantageously carried out before bonding, so that the weakening resulting from the implantation can develop during the heat treatment for recrystallization. The separation then occurs within that weak layer, in immediate proximity to the bonding interface.

That reference layer is preferably of thickness comprised between a few nanometers and several hundreds of microns. The material constituting that reference layer is advantageously identical to that of the amorphous zones, an effect of which is that the amorphous zones recrystallize with a lattice size that is natural for that material. However, for that reference layer a material different from that of the amorphous zones may be chosen, when for example it is desired to recrystallize those amorphous zones in a stressed state; the material of the reference layer and that of the amorphous zones advantageously comprise a common element, such that, when the material of the amorphous zones is silicon, the material of the reference layer is advantageously an alloy of silicon (for example with germanium) chosen to induce the desired state of constraint (by way of example, the use of relaxed $Si_{0.8}Ge_{0.2}$ for the reference layer contributes to recrystallizing amorphous zones of silicon stressed in tension).

The mixed layer is advantageously formed from a single material having, according to the zones, one or other of the predefined crystallographic orientations. It is advantageously a mixed layer of silicon, which is for example, according to the zones, oriented at <100> or <110>. However, it can be easily understood that the mixed layer may be formed, according to needs and any other semiconductor material, such as germanium or one of its alloys with silicon, other alloys of silicon such as SiC, or alloys between elements of groups III and V of the periodic table of the elements, or carbon, or quartz, or $LiTaO_3$, $LiNbO_3$, etc.

When the mixed layer is formed from a single material in the various zones, the formation of the amorphous zones may be obtained by rendering zones amorphous within a monocrystalline layer having that one of the crystallographic orientations which is not the one of the reference layer (i.e. that which the first zones will have, at the end of the mixed layer production).

It can however be seen that the formation of the amorphous zones may also be made by hollowing out cavities in a monocrystalline layer (having the crystal properties of the future first zones) then filling them with a new material, which has the advantage in particular of making it possible obtain mixed layers whose zones not only have different crystalline orientations, but also different constituent materials. The fact of forming the amorphous zones by deposit may, even when they are produced from the same material as the rest of the mixed layer, have the advantage of leading to less recrystallization of the amorphous zones starting from the adjacent zones, since the formation of the amorphous zones by deposit induces a considerably lower crystallographic compatibility with those adjacent zones than when amorphization is carried out.

It is to be noted that the deposit of the amorphous material may be carried out in an oven, on several substrates (for which the term wafer is sometimes used when it is a disc of a few tens of centimeters diameter, for example 30 cm). This is thus a well-known collective treatment, which leads to a reliable and fast production at moderate cost.

The zones of the mixed layer are advantageously formed, by amorphization or by deposit of amorphous material, with a thickness equal to the thickness of that layer, such that the free surface of the first substrate is itself mixed. As a variant, the first zones of the mixed layer only extend, starting from the electrically insulating continuous layer, over a part of the thickness of that mixed layer, the amorphous material being situated no only adjacent to those first zones, but also above them; since the amorphous material thus extends above the first zones and the second zones, it extends continuously along the whole free surface of the first substrate; such a configuration corresponds to a case in which the first substrate is formed from a first layer formed from the material of the first zones, wherein cavities are hollowed out over the full thickness of that first layer and an amorphous material is deposited in those cavities to form the second zones and over a given thickness above the set of the first and second zones.

Advantageously, the underlying electrically insulating continuous layer is an oxide, preferably an oxide of a material of the mixed layer, for example an oxide of the material constituting the amorphous zones; it may be an oxide deposited on a underlying substrate, but also a thermal oxide formed from the latter. Thus this layer is advantageously of silicon oxide. Generally, the material of this electrically insulating continuous layer may be chosen from a wide range of micro-technological materials, provided it is compatible with the recrystallization steps (oxides, or even nitrides, $HfO_2$, and the like); it may be a homogenous layer or a plurality of elementary layers (identical or different).

This electrically insulating continuous layer is advantageously of thickness comprised between a few nanometers and several of microns. It can easily be understood that, if that layer is sufficiently thick, it is possible for it not to need to be supported by an underlying substrate and may in itself constitute a carrier substrate for the mixed layer.

It has been mentioned that the molecular bonding is carried out hydrophobically. This is indeed the best way (or even the only way) of obtaining good and full transmission of the crystalline information across the bonding interface; it has however been found that, if one of the surfaces is hydrophilic, the oxide present at the interface prevents good transmission of that crystalline information.

Advantageously, the heat treatment for recrystallization is carried out at a temperature comprised between 200° C., 1300° C., preferably between 350° C. and 1200° C., according to the materials employed: according to those materials, the duration of the treatment is typically comprised between a few fractions of seconds and a few hours (in particular in the case of the amorphous silicon).

The separation of the seed-forming reference layer, from the at least partly recrystallized mixed layer, may be carried out by the mechanical insertion of a tool (for example a blade) or by a fluid (in particular, gas or water), or by acoustic waves, at least within the weak zone constituted by (or in) the seed-forming layer (when it is porous, at least partly, or when ions have been implanted therein) or by the bonding interface (when its bonding energy is low).

After the separation between the partly recrystallized mixed layer and the seed-forming layer, thermal annealing is advantageously applied to that mixed layer in order to eliminate therefrom the possible crystal defects still present (this annealing is advantageously carried out at a temperature in general higher than the temperature at which the recrystallization was carried out).

Finishing steps may be useful for the structure so obtained, in order to obtain in particular a good surface state in terms of roughness, for example. They may thus be steps such as chemical mechanical polishing, annealing operations in a reducing atmosphere, under a vacuum, etc.

In the aforementioned it was implicitly indicated that the seed-forming layer was continuous and homogenous. This is not necessary for the implementation of the invention. Thus the invention may also be implemented with a seed-forming layer constituted by a discontinuous layer composed of nanowires (that is to say wires of diameter of the order of magnitude of the nanometer, or of a few nanometers, typically less than 5 nanometers), for example nanowires of silicon surrounded by silicon oxide, or else of $Si_xGe_{(1-x)}$.

By way of example, in the case of layers formed from silicon, the silicon nanowires are advantageously produced on a monocrystalline silicon substrate such that they all have the same crystalline information (see for example, "Kuiqing Peng, Ying Xu, Yin Wu, Yunjie Yan, Shuit-Tong Lee and Jing Zhu, small 2005, 1, N° 11, 1062-1067"). The method implemented is for example that described in:

Allon I. Hochbaum, Rong Fan, Rongrui He and Peidong Yang, NANO LETTERS 2005, Vol 5, No. 3, pp 457-460, Kuiqing Peng, Juejun Hu, Yunjie Yan, Yin Wu, Hui Fang, Ying Xu, Shuit-Tong Lee and Jing Zhu, Adv. Funct. Mater. 2006, 16, 387-394.

Preferably, a layer of oxide is then deposited on the set of nanowires and, after a step of chemical mechanical polishing, a surface is obtained composed of oxide and crystalline silicon as explained in "Volker Schmidt, Heike Riel, Stephan Senz, Siegfried Karg, Walter Riess, and Ulrich Gosele, small 2006, 2, No. 1, 85-88". Next is next carried out the hydrophobic bonding on a layer, which is of silicon for example, at least partly amorphous, then annealing for recrystallization. The separation is next made within the composite oxide/nanowire layer, preferably, mechanically and/or chemically (dissolution of the oxide in HF for example). In order to facilitate the separation, it is possible to replace the silicon oxide which is around the nanowires by a layer having a lower mechanical strength, for example with $HfO_2$ or a twin layer composed of $HfO_2$ and of silicon oxide (the upper layer of silicon oxide enabling the chemical mechanical polishing to be facilitated to obtain a flat surface necessary for the molecular bonding).

As stated previously with regard to the seed-forming layers, the nanowires may be not of silicon but of another material such as germanium if it is desired to recrystallize the germanium (according to the usual crystal form of germanium).

It is also possible to make $Si_{(1-x)}Ge_x$ ($x=0.2$, for example) grow on the top of the silicon nanowires, an advantage of which is in particular to obtain $Si_{(1-x)}Ge_x$ with a relaxed lattice parameter and without stress within the nanowire. On recrystallization of the amorphous zones (for example of silicon), it is the parameter of the nanowires which serves as seed, which, after recrystallization and after separation, enables silicon to be obtained with a lattice parameter corresponding to the $Si_{(1-x)}Ge_x$, and thus with internal stress.

It can be understood that the interest in using nanowires, rather than a homogenous layer, to form the seed-forming layer is that the presence of several materials may facilitate the separation. The nanowires also make it possible to obtain relaxed material easily.

BRIEF DESCRIPTION OF THE DRAWING

Aims, features and advantages of the invention will appear from the following description, given by way of non-limiting illustration, with reference to the accompanying drawings in which.

DETAILED DESCRIPTION

First Example Embodiment

FIGS. 1 to 5 illustrate a first embodiment of the invention, which is particularly simple.

A starting substrate 10 is commenced with which comprises (see FIG. 1) an electrically insulating continuous layer 11 and a monocrystalline layer 12 oriented following a predetermined orientation.

Figure 1:
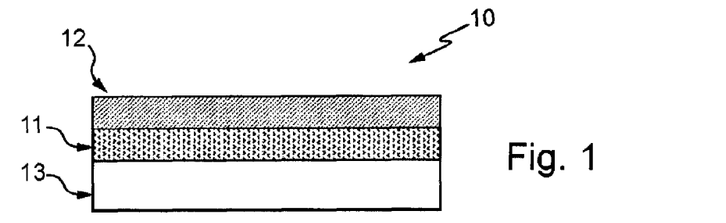
FIG. 1 is a cross-section view of a first substrate adapted for the production of a hybrid substrate according to the invention.

The monocrystalline layer 12 here is of thickness less than the micron, for example of the order of 60 nm.

As the continuous layer 11 is also, in the example considered here, of thickness less than a micron (of the order of 600 nm) it is itself supported by a carrier (or underlying) substrate 13.

In the example considered, the carrier substrate is of silicon, that is polycrystalline (but it will become apparent below that the material constituting that carrier substrate does not have a role in the implementation of the invention, nor do its crystalline characteristics); moreover, the continuous layer 11 is of silicon oxide, for example formed by thermal oxidation of the carrier substrate 13; as for the layer 12, it is also of silicon here, with a predetermined orientation, (in particular a <100> orientation).

Such a first substrate 10 may be analyzed as being a structure of SOI type; initially this abbreviation designated a structure comprising silicon on the insulator (Silicon On Insulator), but, given the development of the use of other materials in micro-technology, this abbreviation now commonly designates a semiconductor on an insulator (Semiconductor On Insulator).

Figure 2:
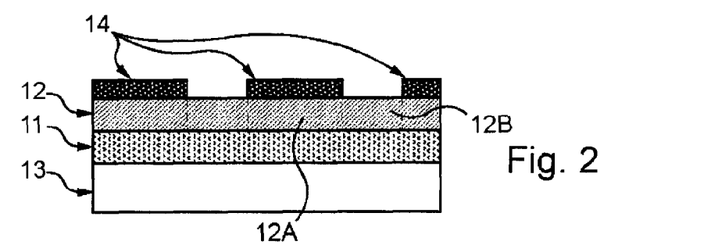
FIG. 2 is a cross-section view, after a first preparation step, according to a first embodiment.

A first step of preparation of that substrate is schematized in FIG. 2, with the deposit of a discontinuous mask 14 adapted to delimit, in the layer 12, first masked zones 12A and second non-masked zones 12B.

Figure 3:
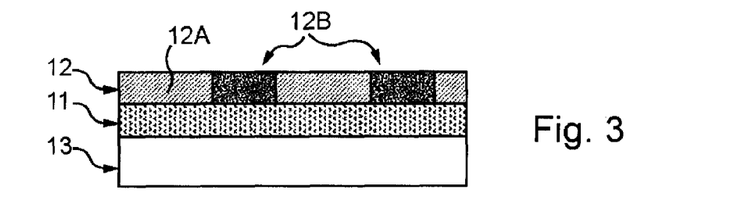
FIG. 3 is a cross-section view after a second preparation step, according to that first embodiment.

FIG. 3 schematizes a second step of preparing the substrate 10 consisting in rendering amorphous, by local implantation of ions, the non-masked zones 12B of FIG. 2.

It can be understood that the formation of the mask 14 may be carried out in several elementary steps, entirely within the capability of the person skilled in the art. Generally it may be said that the formation of this mask is obtained by microlithography techniques known per se. They are advantageously masking operations by photolithography.

After the elimination of the mask 14 (see FIG. 3), the substrate 10 comprises a mixed layer 12 which has extending along it an electrically insulating continuous underlying layer 11 and which is formed from first monocrystalline zones 12A of at least a first crystalline material and from second adjacent zones 12B of a second material in amorphous form, those second zones forming at least part of the free surface of that first substrate. In the example considered, the first and second zones are from the same material, i.e. silicon.

In fact, since the zones 12A and 12B extend over the whole thickness of the layer 12, the same mix may be observed here at the interface with the underlying layer and at the surface.

Next (see FIG. 4) that first substrate 10 is assembled to a second substrate 20 by hydrophobic molecular bonding on at least those amorphous zones, the second substrate comprising a reference layer at the surface having a given crystallographic orientation. In the example considered here, the substrate 20 is homogenous and monocrystalline, such that as a whole it forms a reference layer having a given crystallographic orientation. However, as a variant not represented, the reference layer is limited, in thickness, to a portion of that substrate extending along the free surface (oriented downwardly in FIG. 4), which enables the rest of the substrate 20 to be of any material, monocrystalline or polycrystalline, of any crystallographic orientation.

Figure 4:
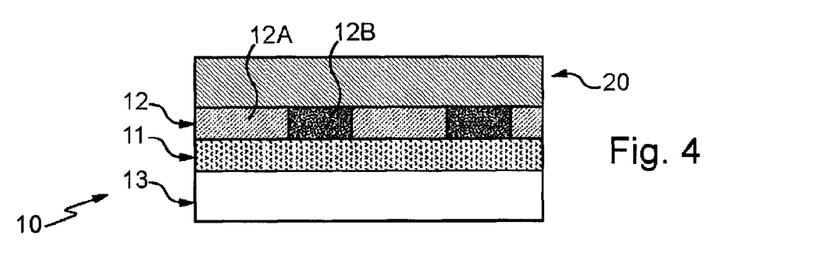
FIG. 4 is a cross-section view of a temporary assembly of that first substrate, according to that first embodiment, with a second substrate.

That layer is advantageously constituted from the same material as that of the amorphous zones 12B, here of silicon. More generally, it is of a material having crystallographic parameters (in particular from the point of view of orientation and lattice size) compatible with the possible crystallographic configurations of the amorphous material. Most often, an element and its oxide do not have compatible crystal properties, in particular in the case of silicon.

In the example embodiment described, the reference layer is a substrate (typically of 725 μm thickness). This reference layer has a different crystallographic orientation from that of the zones 12A, which, in the example considered, corresponds to <110>.

Figure 5:
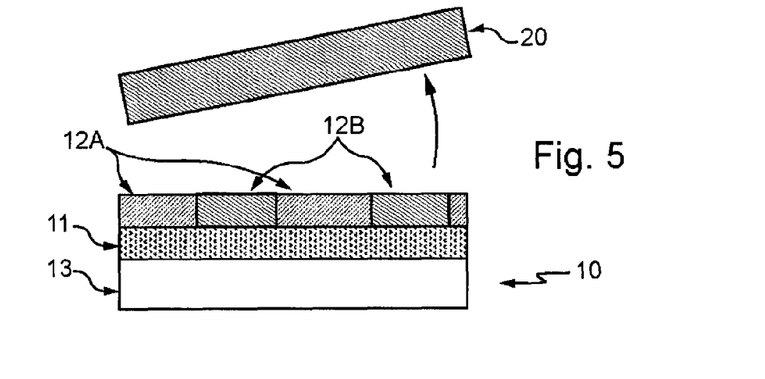
FIG. 5 is a cross-section view of that assembly after a step of recrystallization and a step of separating the first substrate from the second substrate.

Next, to at least the reference layer and to the mixed layer (in practice to the whole of the assembly 10+20), a heat treatment is applied which is suitable for inducing the recrystallization of the amorphous material which constitutes the zones 12B (see FIG. 5). By virtue of the molecular bonding established at the interface between the amorphous zones and the reference layer, this recrystallization is made following the crystallographic parameters of the reference layer rather than with those of the underlying layer of oxide; in fact, there may be a concomitant phenomenon of recrystallization of the amorphous zones starting from the interfaces with the zones 12A that remained crystalline, but it is generally moderate given the real dimensions of the amorphous zones (their thickness is, in the drawings, very exaggerated relative to their width parallel to the continuous layer).

The zones 12B thus recrystallize following the orientation of the reference layer, i.e. following the orientation <110> whereas the adjacent zones have kept the original orientation of <100>.

This annealing may for example consist of a temperature ramp of 0.5° C./min between 200° C. and 1200° C.

Lastly, by any known appropriate means, the separation is induced of the first substrate, of which the zones 12B have now recrystallized, from the second substrate (see also FIG. 5).

This separation is produced here by unbonding of the bonding interface, which requires the bonding to have been carried out in a manner leading to sufficient mechanical strength to ensure that the reference layer acts as a recrystallization seed at the time of the heat treatment, but sufficiently weak to enable separation, after that recrystallization, without degrading the substrates, in particular the mixed layer 12. It should be recalled here that a recrystallization treatment is a heat treatment which in practice is at a sufficiently high temperature to tend to consolidate the molecular bonding, such that account must be taken thereof to define the compromise in the conditions of implementation of the molecular bonding.

Several types of treatment (chemical, thermal, plasma, mechanical, and the like) are within the capability of the person skilled in the art to prepare the surface of the reference layer and that of the mixed layer to make them compatible, from the points of view of flatness, roughness and chemical nature, with such a step of hydrophobic molecular bonding leading to a "demountable" interface.

Next, optionally, a surface treatment (chemical and/or thermal and/or mechanical, etc.) is carried out to adapt the surface exposed by the demounting of the interface further to the treatment which the hybrid substrate is destined to have applied to it.

This surface treatment may, as a variant not represented, be replaced by a thinning treatment aiming to reduce the thickness of the mixed layer, or of the carrier substrate.

Other optional operations may be applied, such as the formation of trenches (see "Direct Silicon Bonded (DSB) Substrate Solid Phase Epitaxy (SPE) Integration Scheme Study for High Performance Bulk CMOS" by Yin, Sung, Ng, Saenger, Chan, Crowder, Zhang, Li, Ott, Pfeiffer, Bendernagel, Ko, Ren, Chen, Wang, Liu, Cheng, Mesfin, Kelly, Ku, Luo, Rovedo, Fogel, Sadana, Khare, Shahidi, which appeared in 1-4244-0439-8/06/$20.00 © 2006 IEEE,) between the zones 12A and 12B, before or after the amorphization (or even before or after the recrystallization).

The substrate 10 of FIG. 1 has thus become a hybrid substrate, enabling in particular the simultaneous production of field effect transistors of nFET type (on the zones with orientation <100>) and pFET (on the zones of orientation <110>).

It can easily be understood that it is possible, in similar manner, to prepare a hybrid substrate not having two families, but three (or more) families of zones each having a given crystallographic orientation.

The thermal annealing for recrystallization may, as a variant, be carried out in two steps (or even more), of which a first step is sufficient to induce the recrystallization of a part, which may possibly be small, of the thickness of the amorphous zones starting from the interface. After separation, the recrystallization of the rest of the amorphous layer may be obtained, in one or more steps, using the recrystallized parts as seed for the rest of the amorphous zones. The first step is for example a faster ramp than that mentioned above.

According to still another variant, the seed-forming layer is weakened in advance by an appropriate implantation of ions, so as to localize the future separation.

Second Example Embodiment

FIGS. 6 to 9 schematize a second example embodiment of the method of the invention.

In these FIGs., the elements that are similar to those of FIGS. 1 to 5 are designated by reference signs which can be deduced from those used on those FIGS. 1 to 5 by the addition of the number 100.

Figure 6:
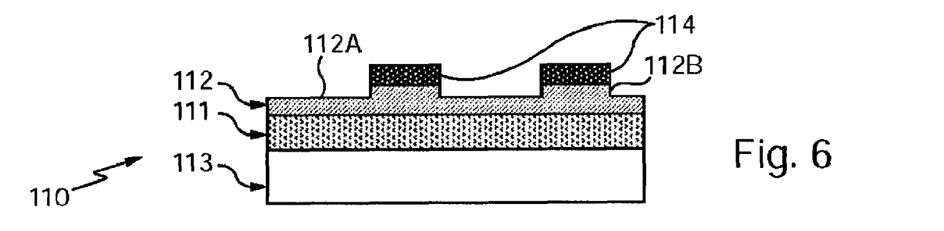
FIG. 6 is a cross-section view of a first substrate similar to that of FIG. 1 after a first preparation step according to a second embodiment.

As in the first example, a substrate 110 of SOI type is commenced with, which is formed from an electrically insulating continuous layer 111 on a carrier substrate 113, and from a monocrystalline layer 112. This substrate 110 has the same dimensions and the same natures of layer as the substrate 10; it is thus formed from a carrier substrate of silicon, for example polycrystalline, covered with a layer of $SiO_2$, itself covered by a monocrystalline layer of silicon of orientation <100>.

In contrast to FIG. 2, the first preparation step schematized in FIG. 6 comprises the formation of a first discontinuous mask 114 covering zones 112B adapted to change crystal properties; furthermore, this first step comprises thinning of the non-masked zones 112A. Of course, this thinning, which corresponds in FIG. 6 to a reduction of approximately half of the initial thickness of the layer 112, may be more moderate.

Figure 7:
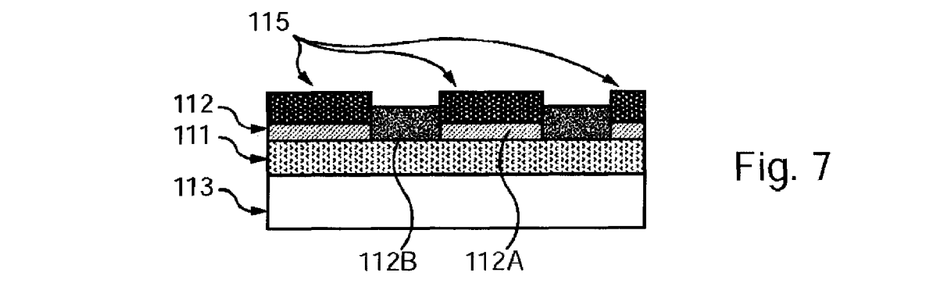
FIG. 7 is a cross-section view after a second preparation step, according to that second embodiment.
Figure 8:
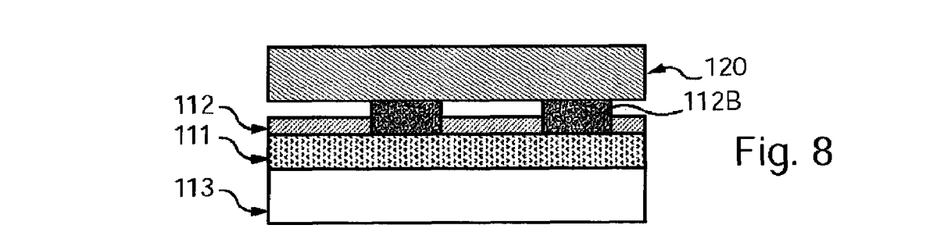
FIG. 8 is a cross-section view of a temporary assembly of that first substrate, according to that second embodiment, with a second substrate.

FIG. 7 schematizes a second preparation step corresponding to those of FIGS. 2 and 3, that is to say to a step whereby, in combination with the elimination of the mask 114, a second discontinuous mask 115 is formed covering the zones 112A destined to keep their crystalline orientation and the non-masked zones are rendered amorphous; given the first step of FIG. 6, the amorphization is carried out to a thickness (initial thickness of the layer 112) which is greater than the thickness of the masked zones 112A. The mask 115 is then removed; these various steps of microlithography are, per se, well known to the person skilled in the art.

At this stage, the first substrate comprises amorphized zones 112B which project relative to zones 112A which have remained intact from the crystallographic point of view.

It can thus be understood (see FIG. 8), that the placing in contact of the first substrate 110 with a second substrate 120 (of orientation <110>), here identical to that of the first example embodiment of the invention, is only made via the free surface of those amorphized zones; possible extraneous reactions are thus avoided at the facing surfaces of the first zones 112A and of the reference layer 120.

Figure 9:
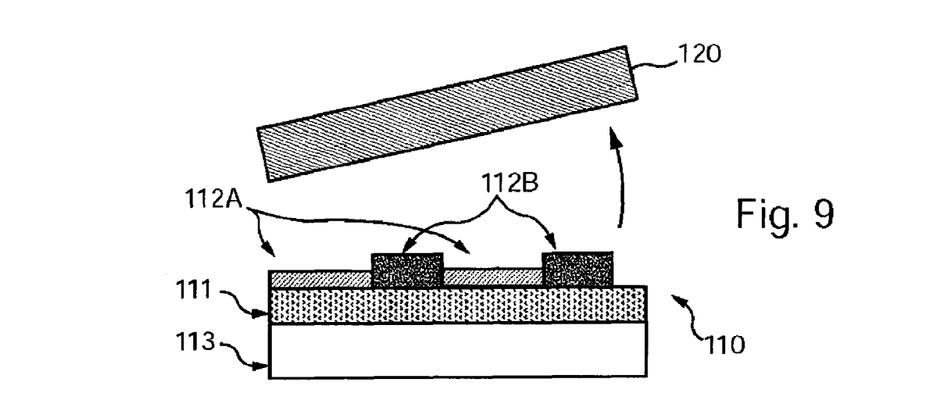
FIG. 9 is a cross-section view thereof after a recrystallization step and a separation step.

After application of an annealing treatment suitable for inducing the recrystallization of the amorphized zones, the implementation of the method of the invention according to this second example comprises a step of separating, by any appropriate means, the second substrate from the first substrate (see FIG. 9).

The same optional operations as in the first example may then be carried out. In practice, it is recommended to carry out polishing (or any other smoothing treatment, for example annealing under $H_2$, annealing under a vacuum, etc.) aimed at making up the difference in level between the free surfaces of the zones 112A and 112B; nevertheless, it is possible that this different may be taken advantage of, for example for producing components in whole or in part.

Thus, this second example embodiment of the invention is distinguished from the first example by the fact that the hydrophobic molecular bonding is limited to the zones to recrystallize, which tends to protect the zones that have to keep their crystal properties.

As in the first example, the annealing for recrystallization may be carried out in two steps separated by the separation step.

Third Example Embodiment

It may be noted that, according to the first and second embodiment examples, a first substrate of SOI type is commenced with, of which the upper layer has the crystal properties of one of the families of the zones that it is desired to form in the mixed layer; the formation of the amorphous zones is carried out therein by amorphization of a part of that upper layer. FIGS. 10 to 14 represent a third example embodiment of the invention implementing another type of formation of amorphous zones.

In this third embodiment example, the elements similar to those used in relation to the first example are designated by reference signs which are deduced from those of that first example by addition of the number 200.

Figure 10:
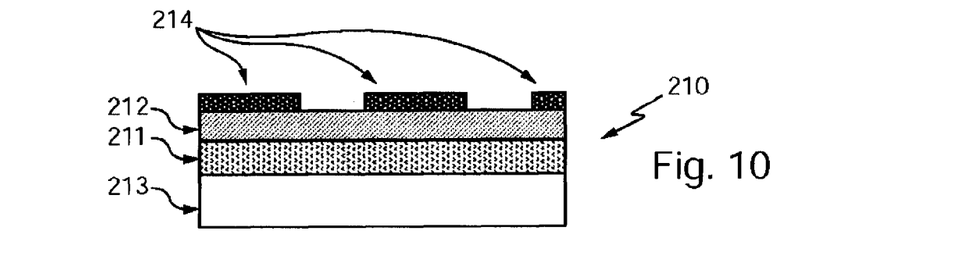
FIG. 10 is a cross-section view of still another first substrate, after a first preparation step according to a third embodiment.

Thus, in this third example embodiment, a starting substrate 210 is commenced with comprising an electrically insulating continuous layer 211 carried by a carrier substrate 213 and surmounted by a monocrystalline layer 212. It is advantageously a substrate of SOI type identical to that used in the first and second examples.

FIG. 10 is similar to FIG. 2, the layer 212 being covered by a discontinuous mask 214.

In contrast to the first and second examples, the mask 214 is used not to selectively amorphize zones of the original layer, but to hollow out that layer, at the location of the non-masked zones 212B, to reach the continuous layer 211 (see FIG. 11), by means of etching with a solution of any appropriate known type.

Figure 11:
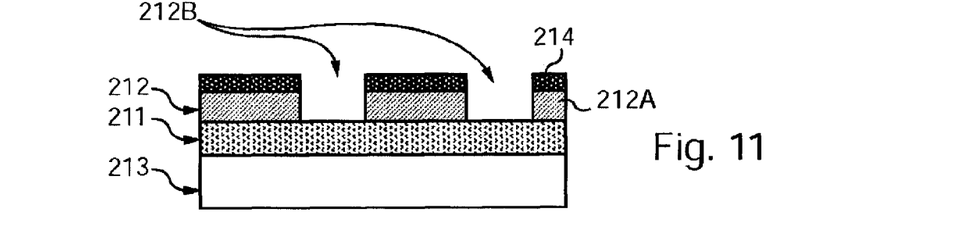
FIG. 11 is a cross-section view after a second preparation step, according to that third embodiment.
Figure 12:
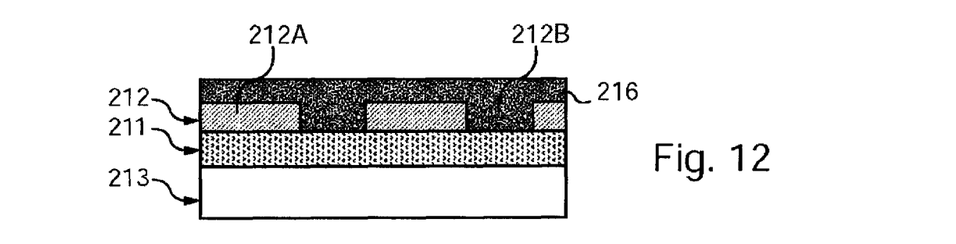
FIG. 12 is a cross-section view after a third preparation step, according to that third embodiment.

This etching step is followed by a step (see FIG. 12) of depositing an amorphous material so as to fill the cavities 212B; in the example schematized here, the deposit of the amorphous material is continued not only until the cavities formed at the step of FIG. 11 are filled, but also until a continuous film 216 is formed covering the entirety of the initial layer 212; the free surface of the first substrate is then entirely constituted by the amorphous material.

Where the amorphous zones are formed by deposit of a material, that material may, in contrast to the first and second examples, be different from that of the original layer 212. However, in the example considered here, that material is silicon, as in the previous examples.

Figure 13:
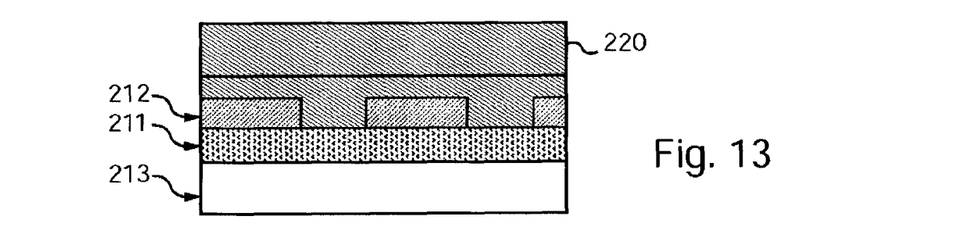
FIG. 13 is a cross-section view of an assembly of that first substrate, according to that third embodiment, to a second substrate.

As previously, optional steps of preparing the free surface of the first substrate are carried out, of any appropriate type (chemical, thermal, plasma, mechanical, and the like) so as to render that free surface of the first substrate compatible with demountable hydrophobic molecular bonding (see FIG. 13) with a second substrate 220 comprising at least at the surface a reference material adapted to form a recrystallization seed on later treatment for recrystallization of the amorphous material (see that FIG. 13).

It can be understood that obtaining good control of the mechanical strength of the interface between the two substrates is facilitated here by the fact that, at this bonding interface, the first substrate is entirely formed from a single homogenous material.

As previously, the demounting of the bonding interface is next carried out by any appropriate means (see FIG. 14); possible steps of finishing may then be carried out, as in the previous examples.

Figure 14:
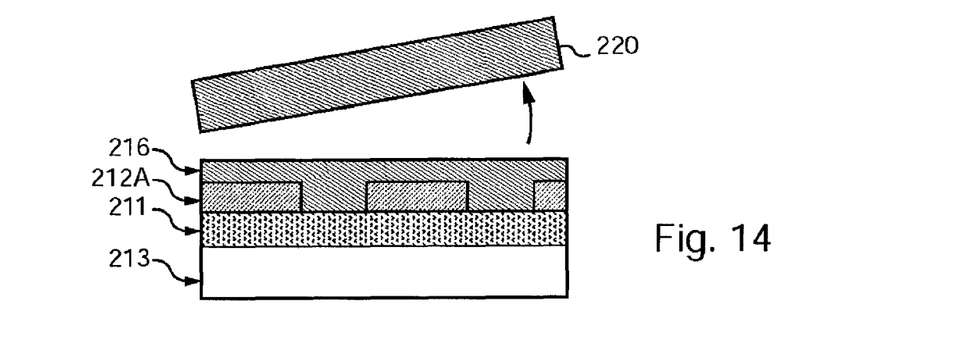
FIG. 14 is a cross-section view of that assembly after a recrystallization step and a separation step.

In contrast to the previous examples, the implementation of this third example results in the formation of a mixed layer comprising, along the electrically insulating continuous layer, alternating monocrystalline zones having different crystallographic orientations, whereas there is a single crystallographic orientation along the surface exposed by the separation. In other words, the mixed layer comprises families of zones which are of different thickness, here respectively defined by the thickness of the original layer 212 and by the maximum thickness of amorphous material deposit.

Figure 15:
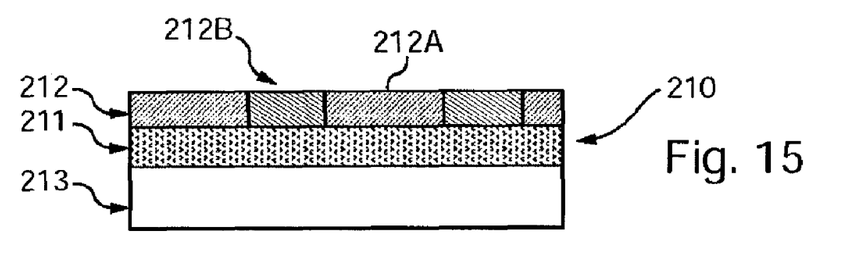
FIG. 15 is a cross-section view after an optional thinning step.

According to needs, an optional thinning step may be carried out in order to result in a mixed layer in which the zones of different crystallographic orientation extend over the same thickness (see FIG. 15).

It should be noted that, as a variant of this third example embodiment, a weakening step, typically by ionic bombardment (according to the "Smart Cut™" technology for example) may be carried out within the continuous layer 216 surmounting the initial zones 212A, which makes it possible to avoid having to eliminate that continuous layer by polishing.

As previously, the recrystallization may be carried out in several steps.

Separation Variant

The preceding examples implement demountable bonding, the mechanical strength of which is thus controlled so as to be able to be separated, despite the consolidation resulting from the annealing treatment necessary for the recrystallization.

Figure 16:
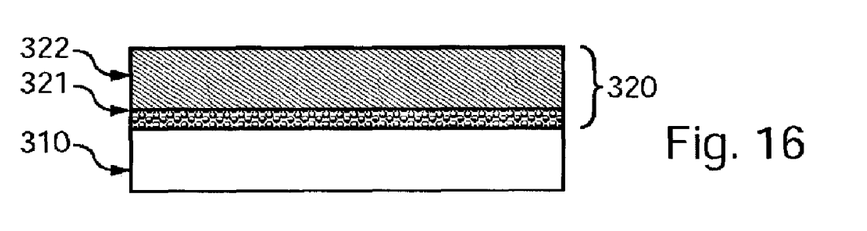
FIG. 16 is a diagrammatic view in cross-section of another assembly, according to a variant embodiment.
Figure 17:
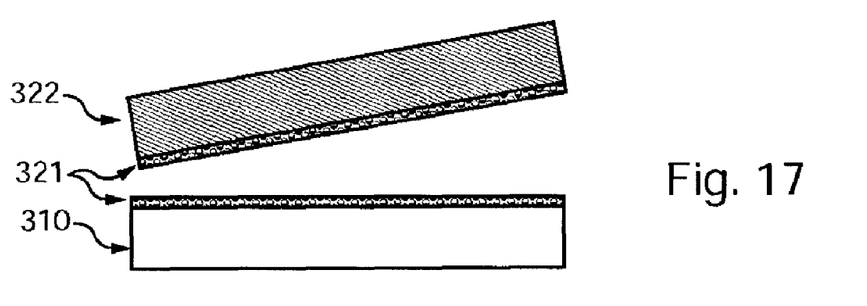
FIG. 17 is a view after a separation step according to another embodiment.

FIGS. 16 and 17 illustrate a variant of the separation step (and thus of the preparation of the second substrate).

FIG. 16 illustrates a step consisting of weakening the second substrate 320 in immediate proximity to the free surface thereof which is destined to be bonded to the first substrate, represented under the reference 310 (it may be any one of the first substrates of the preceding examples). The result of this weakening is schematized by a layer 321 which extends along that free surface. It is advantageously a porous layer.

That porous layer may be formed, to a given thickness of the second substrate starting from its free surface, for example by exposure to a HF based electrolyte under external polarization. This treatment is advantageously carried out before the placing in contact and the hydrophobic molecular bonding of the second substrate with the first substrate.

After the annealing for recrystallization (which may have modified that porosity), the separation is induced within that porous layer, for example by insertion of a tool such as a blade, or by injection of a fluid under high pressure.

The configuration of FIG. 17 is then obtained, further to which a polishing treatment of any appropriate known type enables the bonding interface to be exposed. However, according to the applications, it may be admissible to keep a part of the porous layer, or on the contrary to continue the polishing until the mixed layer has been thinned.

It will be appreciated that the second substrate may be re-used for new cycles of recrystallization; this is true in the first and second examples in which the separation is made at the bonding interface, but also in the third example, since only a small thickness is consumed at each recrystallization cycle.

The invention claimed is:

1. A method of producing a hybrid substrate, the method comprising:
preparing a first substrate comprising a mixed layer and an underlying electrically insulating continuous layer, the mixed layer comprising first monocrystalline zones of at least a first crystalline material and second adjacent amorphous zones of a second material, the second zones forming at least part of a free surface of the first substrate;

bonding a second substrate to the first substrate by hydrophobic molecular bonding over at least the amorphous zones, the second substrate comprising a surface reference layer having a given crystallographic orientation;

applying a heat treatment to at least to the mixed layer, the heat treatment adapted to induce the recrystallization in solid phase of at least part of the amorphous zones following the crystallographic orientation of the reference layer, the reference layer acting as a recrystallization seed through a molecular bonding interface; and inducing a separation at the molecular bonding interface between the reference layer of the second substrate and the at least partly recrystallized amorphous zones of the first substrate.

2. A method according to claim 1 further comprising inducing roughening in at least one bonding face of the first or second substrates prior to bonding and inducing the separation at the molecular bonding interface.

3. A method according to claim 2, wherein roughening comprises obtaining a roughness between 0.1 nm and 1 nm RMS.

4. A method according to claim 1 further comprising preparing the second substrate so as to degrade a mechanical strength of the reference layer adjacent to the molecular bonding interface.

5. A method according to claim 4, wherein preparing the second substrate comprises providing a reference layer having a porous part, and inducing the separation within the porous part.

6. A method according to claim 1, wherein the reference layer comprises a material substantially identical to that of the amorphous zones.

7. A method according to claim 1, wherein the reference layer and the amorphous zones comprise a common element.

8. A method according to claim 1, wherein the mixed layer is formed from a single material having, according to the zones, predefined crystallographic orientations.

9. A method according to claim 8, wherein the second amorphous zones are formed by amorphization of a monocrystalline layer initially having the crystallographic orientation of the first monocrystalline zones.

10. A method according to claim 1, wherein the second amorphous zones are formed by hollowing out cavities in a monocrystalline layer initially having the crystallographic orientation of the first monocrystalline zones and depositing a second amorphous material in the cavities.

11. A method according to claim 10, wherein depositing the amorphous material is carried out until a layer covering the first monocrystalline zones has been formed.

12. A method according to claim 1, wherein the first and second zones comprise silicon and the electrically insulating continuous layer comprises silicon oxide.

13. A method according to claim 1, wherein the heat treatment adapted to induce recrystallization is adapted to induce the recrystallization of part only of the second amorphous zones and, after inducing a separation, a second heat treatment is applied to complete the recrystallization of the second amorphous zones.

* * * * *